US009601185B2

(12) United States Patent
Talayssat

(10) Patent No.: US 9,601,185 B2
(45) Date of Patent: Mar. 21, 2017

(54) INTEGRATED CMOS CIRCUIT HAVING FIRST AND SECOND CIRCUIT PARTS

(71) Applicant: STMicroelectronics International N.V., Amsterdam (NL)

(72) Inventor: Jacques Talayssat, Opio (FR)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/478,477

(22) Filed: Sep. 5, 2014

(65) Prior Publication Data

US 2015/0078069 A1 Mar. 19, 2015

(30) Foreign Application Priority Data

Sep. 16, 2013 (EP) ..................................... 13368032

(51) Int. Cl.
| | | |
|---|---|---|
| G11C 11/419 | (2006.01) | |
| G11C 8/10 | (2006.01) | |
| H01L 27/11 | (2006.01) | |
| H01L 21/8238 | (2006.01) | |
| H01L 21/761 | (2006.01) | |
| H01L 27/092 | (2006.01) | |
| H01L 27/108 | (2006.01) | |

(52) U.S. Cl.
CPC .............. *G11C 11/419* (2013.01); *G11C 8/10* (2013.01); *H01L 21/761* (2013.01); *H01L 21/823892* (2013.01); *H01L 27/0928* (2013.01); *H01L 27/10894* (2013.01); *H01L 27/10897* (2013.01); *H01L 27/1104* (2013.01); *Y02B 60/50* (2013.01)

(58) Field of Classification Search
CPC .................................................... G11C 11/419

USPC ......................................................... 365/156
See application file for complete search history.

(56) References Cited

U.S. PATENT DOCUMENTS

| | | | | |
|---|---|---|---|---|
| 5,905,685 A | * | 5/1999 | Nakamura | .......... G11C 11/4074 365/205 |
| 6,046,627 A | * | 4/2000 | Itoh | ........................ G11C 5/146 257/E27.062 |
| 6,188,628 B1 | * | 2/2001 | Tomotani | .................. G11C 5/14 365/226 |
| 6,674,112 B1 | * | 1/2004 | Tadaki | ................ G11C 11/4076 257/297 |

(Continued)

FOREIGN PATENT DOCUMENTS

| | | |
|---|---|---|
| JP | 2007287331 | 11/2007 |
| JP | 2007287331 A | * 11/2007 |

OTHER PUBLICATIONS

Translation for JP 2007287331 A is attached.*
EPO Search Report for EP 13368032.2 mailed Feb. 5, 2014 (4 pages).

*Primary Examiner* — Anthan Tran
*Assistant Examiner* — Mushfique Siddique
(74) *Attorney, Agent, or Firm* — Gardere Wynne Sewell, LLP

(57) ABSTRACT

An integrated circuit includes first and second circuit parts that may be arranged close to one another in a single semiconducting substrate. The circuit may use a deep doping well for reducing digital noise, and may implement a sleep mode for reducing power consumption. This circuit may have a random access memory, and may be a radio communication system-on-chip device. The integrated circuit may advantageously be used within a mobile communication apparatus.

19 Claims, 3 Drawing Sheets

(56) References Cited

U.S. PATENT DOCUMENTS

| | | | | |
|---|---|---|---|---|
| 6,917,095 B1* | 7/2005 | Wong | .................... | H01L 21/761 |
| | | | | 257/531 |
| 2002/0034093 A1* | 3/2002 | Shiomi | ................ | G11C 11/412 |
| | | | | 365/154 |
| 2002/0135022 A1* | 9/2002 | Igaue | .............. | H01L 21/823892 |
| | | | | 257/371 |
| 2003/0062559 A1* | 4/2003 | Tamaki | .................... | G11C 7/02 |
| | | | | 257/296 |
| 2003/0076705 A1* | 4/2003 | Yamaoka | ............... | G11C 5/146 |
| | | | | 365/154 |
| 2009/0236633 A1* | 9/2009 | Chuang | .................. | H01L 27/11 |
| | | | | 257/190 |
| 2010/0123253 A1* | 5/2010 | Ooka | ................ | H01L 27/0207 |
| | | | | 257/773 |
| 2010/0219800 A1* | 9/2010 | Fukuoka | ............. | H01L 27/0203 |
| | | | | 323/282 |
| 2011/0063895 A1* | 3/2011 | Komatsu | .................. | G11C 5/06 |
| | | | | 365/156 |
| 2016/0093607 A1* | 3/2016 | Luan | ........................ | G11C 11/39 |
| | | | | 257/370 |
| 2016/0093623 A1* | 3/2016 | Luan | .................... | H01L 21/768 |
| | | | | 257/133 |
| 2016/0329094 A1* | 11/2016 | Luan | .................. | H01L 21/8249 |

* cited by examiner

INTEGRATED CMOS CIRCUIT HAVING FIRST AND SECOND CIRCUIT PARTS

RELATED APPLICATION

This application claims the benefit of European Patent Application No. 13368032.2, filed on Sep. 16, 2013 and titled "INTEGRATED CIRCUIT OF CMOS TYPE COMPRISING FIRST AND SECOND CIRCUIT PARTS", the contents of which are incorporated by reference herein to the maximum extent allowable under the law.

TECHNICAL FIELD

The disclosure relates to a CMOS integrated circuit that has first and second circuit parts, and to a mobile communication apparatus which incorporates this integrated circuit.

BACKGROUND

System-on-Chip (SoC) integrated circuits may contain digital components, analog components, mixed digital-analog components, and radio-frequency functions together in a single chip substrate. The circuit may also be a mixed-signal system, which implements radio and baseband functions for each radio communication implementation. Such SoC circuits may be designed for mobile communication apparatuses, for example mobile user equipments such as mobile phones and touchpad apparatuses.

For such apparatuses, power consumption is a concern for preserving battery lifetime. Thus, sleep modes may be implemented where some of the functions are in idle state, so as to reduce the power consumption. However, the residual power consumption of a circuit in an idle state may be due to leakage currents which flow from the components of the circuit to the grounded portion of the circuit substrate.

Additionally, the idle state for a SoC may apply to one part of this circuit but not to another part of the same circuit. For example, an ST C040 RAM (random access memory) circuit is a two-part integrated circuit, with a first part called MATRIX and corresponding to the RAM cell array, and a second part called PERIPHERY and corresponding to the built-in logic suitable for decoding addresses of the memory cells in the array and performing read/write control towards the cells. To help reduce the leakage currents while ensuring the content stored in the memory is maintained, the ST C040 RAM is provided with a built-in switching unit capable of switching-off the periphery logic, while still supplying the memory cell array MATRIX with a retention voltage which is lower than functional power supply. Thus, the leakage current in the periphery logic is suppressed during the sleep mode of the RAM circuit.

In addition, the provision of a deep doping well in a CMOS circuit with digital functions is efficient for reducing the noise which is generated by the operation of the digital circuit. Indeed, such digital noise can interfere with radio functions if no protection is provided. However, the deep doping well is electrically coupled to upper doping wells which are arranged in the active upper layer of the circuit, and which contain components such as MOS transistors. For this reason, it is helpful for a two-part CMOS circuit, with one circuit part which is intended to be driven in the off-state while the other circuit part is maintained with a retention voltage, to have both circuit parts be provided with respective deep doping wells which are separated and electrically isolated from each other.

However, such separation of the deep doping wells may not be compatible with the circuit layout. Indeed, the separating distance between the respective active areas of the matrix and the periphery logic of a ST C040 RAM may be short, depending on the lithography technology used for producing the integrated circuit.

For the purpose of illustrating the situation before the present disclosure, FIG. 1 shows a cross-sectional diagram of a ST C040 RAM combined with deep doping well provision. The CMOS integrated circuit 100 includes a first circuit part 10 and a second circuit part 20 which are arranged close to one another in a single semiconducting substrate. For the particular case of the circuit 100 being a ST C040 RAM, the circuit part 10 may contain the memory cell array, and the circuit part 20 may contain the built-in logic which is suitable for decoding the addresses of the memory cells and performing read/write control towards the memory cells. Referring to such RAM circuit 100 for example purpose only, the circuit part 10 is denoted "MATRIX" in the Figure, and the circuit part 20 is denoted "PERIPHERY".

The substrate of the circuit 100 comprises in each one of the circuit parts 10 and 20, a substrate surface S, an active upper layer 1, a deep doping well 2, and a bulk portion 3, in the order from the substrate surface S toward a back side of the substrate. The bulk portion 3 of the substrate extends from the first circuit part 10 to the second circuit part 20.

The deep doping well 2 is of a first doping type while the bulk portion 3 is of a second doping type. The active upper layer 1 includes at least one upper doping well of the first doping type and a remaining upper region of the second doping type in each one of the first and second circuit parts 10, 20. Each upper doping well extends down to the deep doping well 2 from the substrate surface S in the corresponding circuit part.

In addition, highly doped terminals of the second doping type are arranged in the upper doping wells of the first and second circuit parts, and other highly doped terminals of the first doping type are arranged in the remaining upper regions of the first and second circuit parts.

In FIG. 1, the following reference numbers correspond to the following elements: 11—upper doping well in the circuit part 10; 12—remaining upper region in the circuit part 10; 21—upper doping well in the circuit part 20; 22—remaining upper region in the circuit part 20; 110—highly doped terminals in the upper doping well 11; 120—highly doped terminals in the remaining upper region 12; and 210—highly doped terminals in the upper doping well 21; 220—highly doped terminals in the remaining upper region 22.

As an example, the substrate of the integrated circuit 100 may be a p-doped silicon substrate. Then, the first and second doping types are respectively n-type and p-type. Thus, each circuit region is labelled in FIG. 1 in accordance with its doping type: n for the deep doping well 2 and the upper doping wells 11 and 21, $p^-$ for the bulk portion 3 of the substrate and the remaining upper regions 12 and 22, $n^+$ for the highly doped terminals 120 and 220 which are respectively within the upper remaining portions 12 and 22, and $p^+$ for the highly doped terminals 110 and 210 which are respectively within the upper doping wells 11 and 21.

The upper doping wells 11 and 21, being n-doped, are provided for arranging the p-MOS transistors of the circuit 100.

For powering the circuit 100, the following supply couplings are arranged. Within both circuit parts 10 and 20, the highly doped terminals 120 and 220 are coupled to a ground supply denoted gndm, and the remaining upper regions 12 and 22 out of the highly doped terminals 120 and 220 are coupled to a substrate supply denoted gndsm. Within the first circuit part 10, the highly doped terminals 110 and the upper doping well 11 itself out of the highly doped terminals 110 are coupled to a common power supply denoted vddma, which is dedicated to the circuit part 10. In addition, within the second circuit part 20, the highly doped terminals 210 are coupled to another power supply denoted vddmp, and the upper doping well 21 itself out of the highly doped terminals 210 is coupled to a substrate power supply denoted vddsmp, with both vddmp and vddsmp supplies being dedicated to the circuit part 20.

For the ST C040 RAM example, the common power supply vddma is the power supply of the memory cell array. With the doping types indicated in FIG. 1, vddsmp is the substrate power supply for the p-MOS transistors of the periphery logic, and gndsm is the substrate supply for the n-MOS transistors of the whole RAM circuit.

Therefore, there is a need in the art for an integrated circuit designed for reduced digital noise, but including two circuit parts, one of which can be on or off while the other remains voltage-supplied.

SUMMARY

This disclosure proposes an integrated circuit of the type described with reference to FIG. 1, but with the following additional and original features. The deep doping well may extend continuously from the first circuit part to the second circuit part. In addition, the integrated circuit may include an electrically conducting path arranged for coupling the upper doping wells of both the first and second circuit parts out of the highly doped terminals, so that the common power supply which is dedicated to the first circuit part and the substrate power supply which is dedicated to the second circuit part are merged. Also, the integrated circuit may include a switching unit which is arranged for electrically coupling, or isolating from one another, the highly doped terminals of the upper doping well of the second circuit as well as the upper doping well of the second circuit part, so that the substrate power supply which is dedicated to the second circuit part further operates as the power supply dedicated to this second circuit part when the switching unit is in a coupling state.

Therefore, this disclosure may combine reduced digital noise and capability to drive the second circuit part into an off-state while the first circuit part remains power-supplied. The digital noise reduction may be provided by the deep doping well, whereas the switching unit may drive the second circuit into power-supply state or off-state by coupling or decoupling the highly doped terminals of the upper doping well in the second circuit part to or from the common power supply. In addition, using a continuous deep doping well which is common to the first and second circuit parts may be consistent with supplying the upper doping wells of both the first and second circuit parts with the same powering voltage. Using a continuous deep doping well which is common to the first and second circuit parts may also be compatible with designing a short separating distance between both circuit parts, thus allowing substrate area savings.

In addition, the following additional features for integrated circuits in accordance with embodiments of the disclosure may be implemented, either separately or in combination with one another. The first circuit part may include a random access memory cell array, and the second circuit part may include a random access memory built-in logic which is suitable for decoding addresses of the memory cells and performing read/write control towards these memory cells. In addition, the integrated circuit may be produced using a lithography technology with a pitch of less than 40 nanometers. Furthermore, the integrated circuit may be designed in accordance with the C040 ST memory specification. Also, the first and second doping types may be n-type and p-type respectively. The upper doping wells may contain pMOS transistors, and the remaining upper regions may contain nMOS transistors. The integrated circuit may form part of a system-on-chip device. The integrated circuit may be designed for implementing at least one radio communication mode, and operation of this radio communication mode may be off when the switching unit is in isolating state. The radio communication mode of concern may be selected from among Bluetooth®, FM radio, Global Positioning System and Near Field Communication. In particular, the integrated circuit may be designed for implementing these all four radio communication modes, and the integrated circuit may be designed for forming part of a mobile communication device, in particular a mobile user equipment such as a mobile phone or a touchpad device.

The disclosure also proposes a mobile communication apparatus which comprises an integrated circuit as described before. This mobile communication apparatus may be a mobile phone or tablet, in particular.

Such a mobile communication apparatus may include a battery arranged for providing at least the common power supply. Then, the mobile communication apparatus may also have a sleep mode controller arranged for controlling the switching unit to be either in a coupling state when the integrated circuit is in operation mode, or in an isolating state when the integrated circuit is in a sleep mode.

According to an improvement of the disclosure, the mobile communication apparatus may include a voltage adaptation module which is arranged so that the common power supply has a functional value when the switching unit is in a coupling state, and a retention value when the switching unit is in isolating state. Advantageously, the retention value of the common power supply may be lower than its functional value. In this way, the power consumption by the first circuit part may also be reduced when the switching unit is in the isolating state, i.e. when the integrated circuit is in sleep mode. Preferably, the voltage adaptation module may be a built-in module, i.e. may be incorporated within the integrated circuit together with the first and second circuit parts.

BRIEF DESCRIPTION OF THE DRAWINGS

Non-limiting embodiments of the disclosure are now described in details with reference to the following figures.

DETAILED DESCRIPTION

For the sake of clarity, the elements represented in the figures are not sized in relation with actual dimensions, nor with ratios of actual dimensions. In addition, reference numbers which are indicated in separate figures denote identical elements or elements with similar functions.

Figure 1:
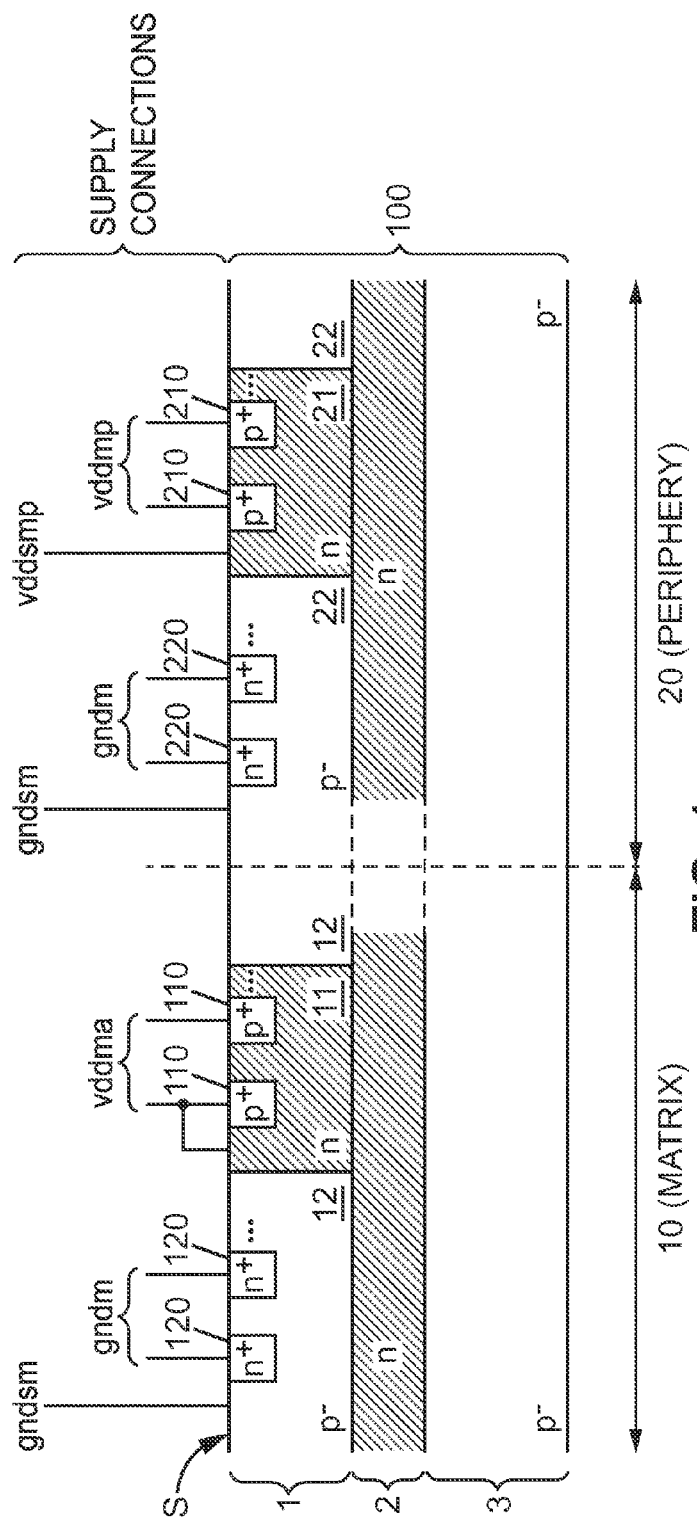
FIG. 1 represents a prior CMOS integrated circuit structure.
Figure 2:
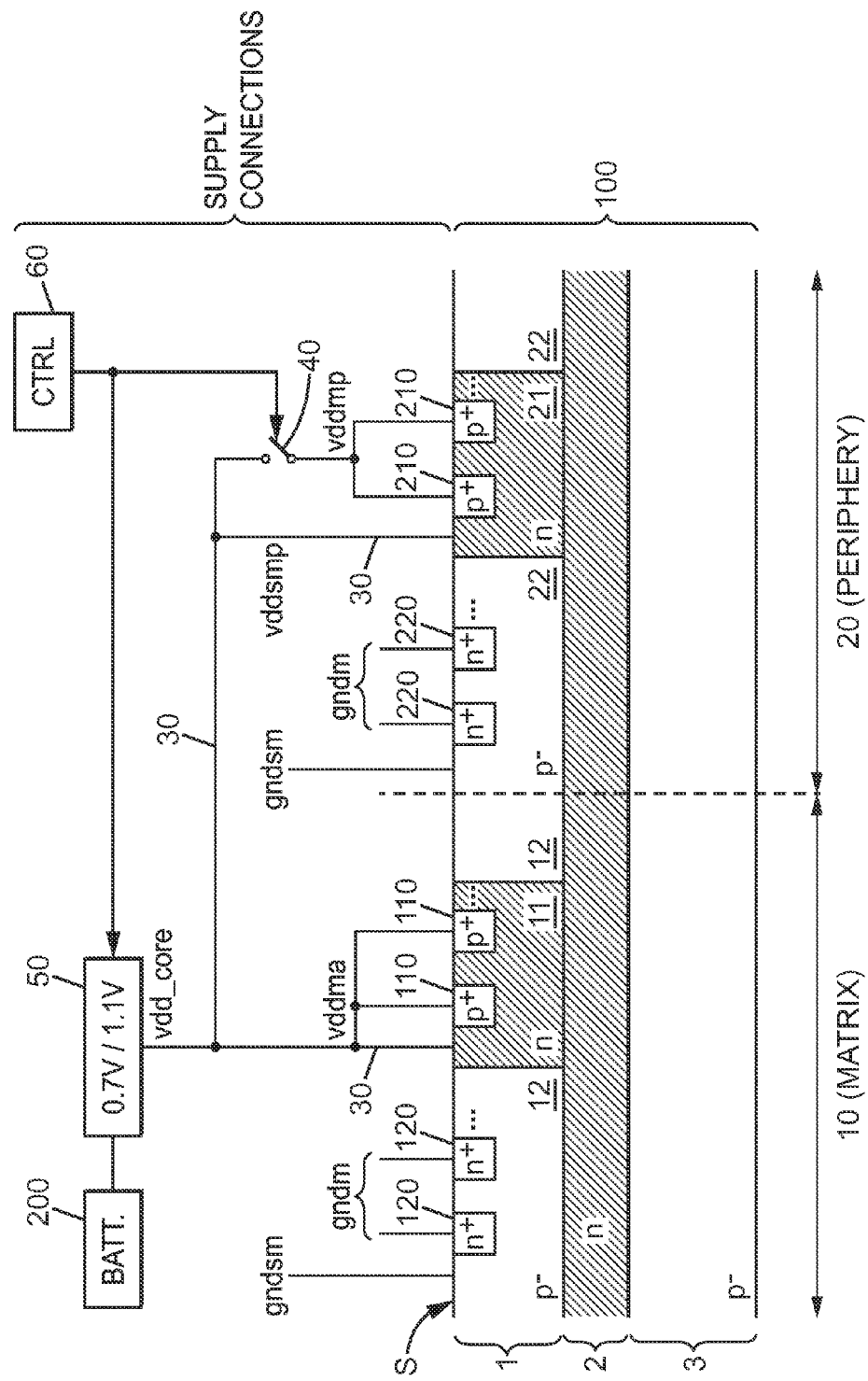
FIG. 2 represents a CMOS integrated circuit structure as modified by the present disclosure.

FIG. 1 has already been described. Because the implementation of the disclosure which relates to FIG. 2 is a modification of the circuit structure of FIG. 1, description of common elements and features is not repeated, and the following description is focused on the elements and operation features which are introduced by the disclosure.

A first feature introduced by the disclosure is that the deep doping well 2 extends continuously from the circuit part 1 to the circuit part 20 through the limit between both circuit parts.

As a consequence of this first feature, the upper doping well 11 in the circuit part 10 and the upper doping well 21 in the circuit part 20 are electrically shorted by the deep doping well 2. For consistency with the first disclosure feature, an electrically conducting path 30 is added within the circuit 100 for coupling the upper doping wells 11 and 21 to one another out of the highly doped terminals 110 and 210. Then, both the common power supply vddma of the first circuit part 10 (MATRIX) and the substrate power supply vddsmp of the second circuit part 20 (PERIPHERY) are equal. Thus, a single power supply, or voltage supply, denoted vdd_core is applied to the substrate in the upper doping wells 11 and 21 of both circuit parts 10 and 20. This power supply vdd_core may originate from a battery 200 directly, or with an optional intermediate voltage adaptation module 50. The battery 200, also denoted BATT in the figures, may be rechargeable when the circuit 100 pertains to a mobile communication device.

Because the substrate in the upper doping well 11 remains electrically shorted with the highly doped terminals 110, the power supply vdd_core is also applied to these latter in the circuit part 10.

A second feature introduced by the disclosure includes adding a switching unit 40 for coupling the highly doped terminals 210 within the upper doping well 21 of the circuit part 20 (PERIPHERY) with the upper doping well 21. Then, when the switching unit 40 is in a coupling state, the highly doped terminals 210 are electrically shorted with the substrate in the upper doping well 21, so that the power supply vdd_core is further applied to the highly doped terminals 210. Thus, the power supply vdd_core also acts as the power supply vddmp for the circuit part 20. When the switching unit 40 is in isolating state, the second circuit part 20 is off.

For the upper remaining regions 12 and 22 of both circuit parts 10 and 20, the ground supply gndm and the substrate supply gndsm may remain split.

Then, the integrated circuit 100 as a whole may be either in operation mode or sleep mode. In operation mode, the switching unit 40 is in coupling state, so that the power supply vdd_core is applied to all the highly doped terminals 110 and 210 in the upper doping wells 11 and 21. Thus both circuit parts 10 and 20, for example the memory cell array and the periphery logic of a ST C040 RAM, are power-supplied and active for circuit operation. In sleep mode, the switching unit 40 is in isolating state, so that the highly doped terminals 210 are discoupled from the power supply vdd_core, while this power supply vdd_core is still applied to the substrate within the upper doping well 21 out of the highly doped terminals 210. Then the transistors located within the upper doping well 21 are not powered, so that the leakage current in the circuit part 20 is suppressed. For a ST C040 RAM designed according to the disclosure, the leakage current in sleep mode is lowered from 10.76 µA (microampere) when both the memory cell array and the periphery logic are power-supplied to 6.54 µA corresponding to the leakage current within the memory cell array only.

In general, the disclosure allows the combining of a switchable circuit part for reducing the leakage current in sleep mode, and the insertion of a deep doping well for digital noise reduction. A sleep mode controller 60, also denoted CTRL, in FIG. 2, may be provided for controlling the coupling or isolating state of the switching unit 40.

The voltage adaptation module 50 and/or the sleep mode controller 60 may be built-in modules integrated within the integrated circuit 100, although this is not apparent from FIG. 2 due to the block representation used for these modules for clarity sake.

According to an embodiment of the disclosure, the voltage adaptation module 50 may be designed for outputting the power supply vdd_core with a variable value. This vdd_core value may be then selected in accordance with the state of the switching unit 40. The value of the power supply vdd_core may advantageously be lower when the circuit 100 is in sleep mode compared to the vdd_core value when the circuit 100 is in operation mode. This applies in particular when the first circuit part 10 is to be maintained in a retention mode when the whole circuit 100 is in sleep mode. The reduction of the vdd_core value which is supplied to the first circuit part 10, from the functional value to a lower retention value, may contribute in reducing the leakage current in the first circuit part 10 during sleep mode period. For example, the retention mode of the circuit part 100 allows retaining bit values which are stored in the memory cells of the ST C040 RAM, while modifying or reading the stored values is not required. Then, the vdd_core value which is output by the voltage adaptation module 50 may be about 1.1 V (volt) when the switching unit 40 is in coupling state, corresponding to the operation mode for the circuit 100, and it may be about 0.72 V when the switching unit 40 is in isolating state, corresponding to the sleep mode for the circuit 100. The leakage current of the cell array of the ST C040 RAM in sleep mode period has been determined to be of the order of one nanoampere when the 0.72 V retention value is used, instead of about 6.5 µA when the vdd_core value is maintained at 1.1 V. Such variation of the value of the power supply vdd_core which is output by the voltage adaptation module 50 may be controlled by the sleep mode controller 60, together with the state of the switching unit 40 with a synchronized control. The retention value for vdd_core is controlled when the switching unit 40 is in isolating state, and the vdd_core functional value is controlled when the switching unit 40 is in coupling state.

Figure 3:
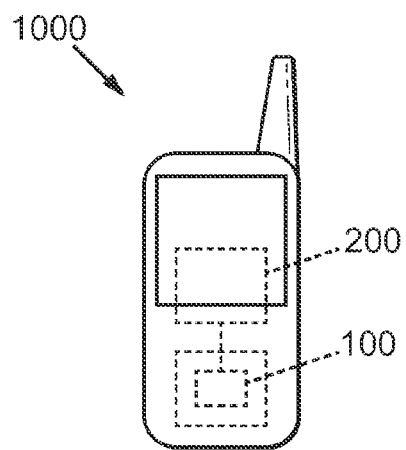
FIG. 3 represents a mobile communication apparatus implementing the teachings of this disclosure.

The integrated circuit 100 may be a SoC device, in particular a SoC device designed for implementing radio communication according to standards among Bluetooth®, FM radio, GPS standing for Global Positioning System and NFC standing for Near Field Communication. The SoC device may implement these radio communication standards and is intended for being incorporated into a mobile communication apparatus such as a mobile phone 1000 as shown in FIG. 3. Then, the mobile communication apparatus may be entered into sleep mode when no action is executed by a user, or when no radio signal is received. Implementation of the disclosure allows maintaining the bit-storing state of the circuit part 10 during the sleep mode period, until the mobile communication apparatus is restarted or waken-up by the user or due to radio signal reception. During the sleep mode period, the radio communication function may be off.

When the circuit 100 is a SoC device designed for radio communication, the second circuit part 20 may further contain electronic components other than those dedicated to the memory cell address decoding and read/write controlling functions. Such other components or modules contained in the circuit part 20 are thus switched off too once the sleep mode is entered, and powered again during the operation mode time periods.

Those skilled in the art will understand that the disclosure may be reproduced while modifying some embodiment aspects which have been described just-above while maintaining the advantages of the disclosure. In particular, the numeral values recited may be adapted and the disclosure is not limited to embodiments relating to random access memories. Additionally, those skilled in electronics will be able to select appropriately electronic modules for producing all the functions cited.

The invention claimed is:

1. A system, comprising:
a semiconductor substrate;
a random access memory defined in the semiconductor substrate;
a logic controller defined in the semiconductor substrate adjacent the random access memory, and configured to decode addresses of memory cells of the random access memory and to perform read/write control for the random access memory;
the semiconductor substrate having, for the random access memory and the logic controller, an active upper layer comprising:
an upper doping well,
a remaining upper region,
first highly doped terminals arranged in the remaining upper region, and
second highly doped terminals arranged in the upper doping well,
wherein the remaining upper region is coupled to a first substrate supply;
wherein the second highly doped terminals are coupled to a common power supply dedicated to the random access memory, within the random access memory;
wherein the upper doping well is coupled to a second substrate power supply dedicated to the logic controller, within the logic controller;
wherein the second high doped terminals are coupled to an other power supply, within the logic controller;
an electrically conducting path coupling the upper doping well of the random access memory and the logic controller so that the common power supply and the second substrate power supply are merged; and
a switching unit configured to selectively electrically short the common power supply, second substrate power supply, and the other power supply to one another and to the second highly doped terminals of the logic controller;
wherein the system is configured to implement at least one radio communication mode, an operation of the at least one radio communication mode being inactive when the switching unit is not coupling the second highly doped terminals of the logic controller and the upper doping well of the logic controller.

2. A system according to claim 1, further comprising a battery configured to provide the power supply, and a sleep mode controller configured to control the switching unit to be in a coupling state to couple the second highly doped terminals of the logic controller and the upper doping well of the logic controller when the system on a chip is in an operation mode, and to be in an isolating state to decouple the second highly doped terminals of the logic controller and the upper doping well of the logic controller when the system on a chip is in a sleep mode.

3. A system according to claim 2, further comprising a voltage adaptation module configured to control the common power supply such that the common power supply has a functional value when the switching unit is in the coupling state, and a retention value when the switching unit is in the isolating state, with the retention value being lower than the functional value.

4. A system according to claim 1, wherein the at least one radio communication mode comprises at least one of UHF radio in ISM radio bands from 2.4 GHz to 2.485 GHz, FM radio, Global Positioning System, and Near Field Communication.

5. An electronic device, comprising:
a semiconductor substrate;
a first circuit part defined in the semiconductor substrate;
a second circuit part defined in the semiconductor substrate adjacent the first circuit part;
the semiconductor substrate having, for the first circuit part and the second circuit part, an active upper layer comprising:
an upper doping well having a first doping type,
a remaining upper region having a second doping type,
first highly doped terminals having the first doping type arranged in the remaining upper region and being coupled to a ground supply, and
second highly doped terminals having the second doping type arranged in the upper doping well,
wherein portions of the remaining upper region not including the first highly doped terminals are coupled to a first substrate supply;
wherein the second highly doped terminals and portions of the upper doping well not including the second highly doped terminals are coupled to a common power supply dedicated to the first circuit part, within the first circuit part;
wherein the second highly doped terminals are coupled to a power supply dedicated to the second circuit part, and portions of the upper doping well not including the second highly doped terminals are coupled to a second substrate power supply dedicated to the second circuit part, within the second circuit part;
an electrically conducting path respectively coupling portions of the upper doping well of the first and second circuit parts not including the second highly doped terminals so that the common power supply and the second substrate power supply are merged; and
a switching unit configured to selectively electrically short the common power supply, second substrate power supply, and the power supply dedicated to the second circuit part to one another and to the second highly doped terminals of the second circuit part and portions of the upper doping well of the second circuit part not including the second highly doped terminals;
wherein the electronic device is configured to implement at least one radio communication mode, an operation of the at least one radio communication mode being inactive when the switching unit is not coupling the second highly doped terminals of the second circuit part and the upper doping well of the second circuit part.

6. An electronic device according to claim 5, wherein the first circuit part comprises a random access memory cell array; and wherein the second circuit part comprises a logic controller configured to decode addresses of the memory cells and to perform read/write control on the random access memory cell array.

7. An electronic device according to claim 5, wherein the first doping type is n-type, and the upper doping well contains pMOS transistors; and wherein the second doping type is p-type, and the remaining upper regions contain nMOS transistors.

8. An electronic device according to claim 5, further comprising a battery configured to provide the power supply, and a sleep mode controller configured to control the switching unit to be in a coupling state to couple the second highly doped terminals of the second circuit part and the upper doping well of the second circuit part when the electronic device is in an operation mode, and to be in an isolating state to decouple the second highly doped terminals of the second circuit part and the upper doping well of the second circuit part when the electronic device is in a sleep mode.

9. An electronic device according to claim 8, further comprising a voltage adaptation module configured to control the common power supply such that the common power supply has a functional value when the switching unit is in the coupling state, and a retention value when the switching unit is in the isolating state, with the retention value being lower than the functional value.

10. An electronic device, comprising:
a semiconductor substrate;
a first circuit part defined in the semiconductor substrate;
a second circuit part defined in the semiconductor substrate adjacent the first circuit part;
the semiconductor substrate comprising, for each of the first circuit part and the second circuit part,
a substrate surface,
an active upper layer,
a deep doping well, and
a bulk portion,
wherein the bulk portion extends continuously from the first circuit part to the second circuit part and has a second doping type,
wherein the deep doping well has a first doping type,
wherein the active upper layer comprises
an upper doping well having the first doping type, and
a remaining upper region having the second doping type in each of the first and second circuit parts,
the upper doping well extending down to the deep doping well from the substrate surface,
first highly doped terminals having the first doping type arranged in the remaining upper region, and
second highly doped terminals having the second doping type arranged in the upper doping well,
the first highly doped terminals being coupled to a ground supply,
portions of the remaining upper regions not including the first highly doped terminals being coupled to a substrate supply;
wherein the second highly doped terminals and portions of the upper doping well not including the second highly doped terminals are coupled to a common power supply dedicated to the first circuit part, within the first circuit part;
wherein the second highly doped terminals are coupled to a power supply dedicated to the second circuit part, and portions of the upper doping well not including the second highly doped terminals are coupled to a substrate power supply dedicated to the second circuit part, within the second circuit part;
wherein the deep doping well extends continuously from the first circuit part to the second circuit part;
an electrically conducting path coupling portions of the upper doping well of the first and second circuit parts not including the second highly doped terminals so that the common power supply dedicated to the first circuit part and the substrate power supply dedicated to the second circuit part are merged; and
a switching unit configured to selectively electrically short the common power supply, the power supply dedicated to the second circuit part, and the substrate power supply dedicated to the second circuit part to one another and to the second highly doped terminals of the second circuit part and portions of the upper doping well of the second circuit part not including the second highly doped terminals when the switching unit is in a coupled state
wherein the electronic device is configured to implement at least one radio communication mode, an operation of the at least one radio communication mode being inactive when the switching unit is not coupling the highly doped terminals of the second circuit part and the upper doping well of the second circuit part.

11. An electronic device according to claim 10, wherein the first circuit part comprises a random access memory cell array; and wherein the second circuit part comprises a logic controller configured to decode addresses of the memory cells and to perform read/write control on the random access memory cell array.

12. An electronic device according to claim 10, wherein the electronic device is produced using a lithography technology with a pitch of less than 40 nanometers.

13. An electronic device according to claim 10, wherein the first doping type is n-type, and the upper doping well contains pMOS transistors; and wherein the second doping type is p-type, and the remaining upper regions contain nMOS transistors.

14. An electronic device according to claim 10, wherein the electronic device is configured to define a system-on-a-chip.

15. An electronic device according to claim 10, wherein the at least one radio communication mode comprises at least one of UHF radio in ISM radio bands from 2.4 GHz to 2.485 GHz, FM radio, Global Positioning System, and Near Field Communication.

16. An electronic device according to claim 10, wherein the at least one radio communication mode comprises a plurality of radio modes, the plurality of radio modes comprising UHF radio in ISM radio bands from 2.4 GHz to 2.485 GHz, FM radio, Global Positioning System, and Near Field Communication.

17. An electronic device according to claim 10, wherein the electronic device is configured to define a mobile communication apparatus.

18. An electronic device according to claim 10, further comprising a battery configured to provide the power supply, and a sleep mode controller configured to control the switching unit to be in a coupling state to couple the highly doped terminals of the second circuit part and the upper doping well of the second circuit part when the electronic device is in an operation mode, and to be in an isolating state to decouple the highly doped terminals of the second circuit part and the upper doping well of the second circuit part when the electronic device is in a sleep mode.

19. An electronic device according to claim 18, further comprising a voltage adaptation module configured to control the common power supply such that the common power supply has a functional value when the switching unit is in the coupling state, and a retention value when the switching unit is in the isolating state, with the retention value being lower than the functional value.

* * * * *